United States Patent
Zeng et al.

(10) Patent No.: US 11,962,328 B1
(45) Date of Patent: Apr. 16, 2024

(54) DECODING METHOD, MEMORY STORAGE DEVICE AND MEMORY CONTROL CIRCUIT UNIT

(71) Applicant: PHISON ELECTRONICS CORP., Miaoli (TW)

(72) Inventors: Shih-Jia Zeng, Hsinchu (TW); Yi-Fang Chang, Taoyuan (TW); Chun-Wei Tsao, Taoyuan (TW); Chen-An Hsu, New Taipei (TW); Wei Lin, Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 17/994,399

(22) Filed: Nov. 28, 2022

(30) Foreign Application Priority Data

Oct. 13, 2022 (TW) .................................. 111138909

(51) Int. Cl.
*H03M 13/00* (2006.01)
*H03M 13/01* (2006.01)
*H03M 13/15* (2006.01)

(52) U.S. Cl.
CPC ..... *H03M 13/1555* (2013.01); *H03M 13/015* (2013.01); *H03M 13/1575* (2013.01)

(58) Field of Classification Search
None
See application file for complete search history.

(56) References Cited

U.S. PATENT DOCUMENTS

| | | | |
|---|---|---|---|
| 2011/0320902 A1* | 12/2011 | Gunnam ................. | H04L 1/005 714/752 |
| 2017/0269991 A1* | 9/2017 | Bazarsky ................. | G06F 3/064 |
| 2018/0157551 A1* | 6/2018 | Ryabinin .............. | G06F 1/3206 |
| 2018/0159555 A1* | 6/2018 | Ryabinin .......... | H03M 13/3715 |
| 2018/0159556 A1* | 6/2018 | Dumchin ............ | H03M 13/6511 |
| 2018/0358986 A1* | 12/2018 | Santhanam ....... | H03M 13/6516 |
| 2019/0087264 A1* | 3/2019 | Tokutomi ............ | G06F 11/1068 |
| 2019/0379405 A1* | 12/2019 | Cho .................. | H03M 13/3707 |
| 2020/0373944 A1* | 11/2020 | Cho ..................... | G06F 11/1048 |
| 2021/0194508 A1* | 6/2021 | Kim .................... | G06F 11/1048 |

* cited by examiner

*Primary Examiner* — Mujtaba M Chaudry
(74) *Attorney, Agent, or Firm* — JCIPRNET

(57) ABSTRACT

A decoding method, a memory storage device and a memory control circuit unit are disclosed. The method includes: activating a decoding circuit which supports a plurality of decoding modes each corresponding to a threshold value, wherein a distribution of the threshold value corresponds to error correction abilities of the decoding modes; reading first data from a rewritable non-volatile memory module; performing, by the decoding circuit, a first decoding operation on the first data; obtaining a decoding parameter according to an execution result of the first decoding operation; and performing, by the decoding circuit, a second decoding operation on the first data based on a first decoding mode among the decoding modes according to a relative numerical relationship between the decoding parameter and the threshold value.

24 Claims, 11 Drawing Sheets

1201

| Decoding mode | Threshold value |
|---|---|
| Decoding mode (1) | TH(1) |
| Decoding mode (2) | TH(2) |
| • | • |
| • | • |
| • | • |
| • | • |
| • | • |
| Decoding mode (N) | TH(N) |

Improved decoding ability $$\begin{Bmatrix} 0 & 0 & 1 & 0 & 1 & 0 & 0 & 1 & 1 \\ 1 & 0 & 0 & 0 & 1 & 0 & 1 & 0 & 0 \\ 0 & 1 & 0 & 1 & 0 & 0 & 0 & 1 & 0 \\ 0 & 1 & 0 & 0 & 1 & 0 & 0 & 1 & 0 \\ 1 & 0 & 0 & 1 & 0 & 0 & 1 & 0 & 1 \\ 0 & 0 & 1 & 1 & 0 & 1 & 0 & 0 & 1 \\ 0 & 1 & 0 & 0 & 0 & 1 & 1 & 0 & 0 \\ 1 & 0 & 1 & 0 & 0 & 1 & 0 & 0 & 0 \end{Bmatrix} \begin{Bmatrix} V_0 \\ V_1 \\ V_2 \\ V_3 \\ V_4 \\ V_5 \\ V_6 \\ V_7 \\ V_8 \end{Bmatrix} = \begin{Bmatrix} S_0 \\ S_1 \\ S_2 \\ S_3 \\ S_4 \\ S_5 \\ S_6 \\ S_7 \end{Bmatrix}$$

FIG. 9

DECODING METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 111138909, filed on Oct. 13, 2022. The entirety of the above-mentioned patent application is hereby incorporated by reference herein and made a part of this specification.

BACKGROUND

Technical Field

The disclosure relates to a decoding method, a memory storage device, and a memory control circuit unit.

Description of Related Art

The rapid growth of mobile phones, tablet computers and notebook computers in recent years has led to a rapid increase in consumer demand for storage media. Since a rewritable non-volatile memory module (e.g. a flash memory) has the characteristics of data non-volatility, power saving, small size, and having no mechanical structure, it is very suitable for being built in a variety of portable multimedia devices as exemplified above.

To ensure the correctness of the data, the data stored in the rewritable non-volatile memory module may be encoded. When reading data from the rewritable non-volatile memory module, the read data may be decoded to correct errors. However, how to achieve a balance between the error correction ability and the decoding speed of the decoding circuit is actually one of the topics that those skilled in the related art are devoted to studying.

SUMMARY

The disclosure provides a decoding method, a memory storage device, and a memory control circuit unit, which may improve decoding efficiency.

An exemplary embodiment of the disclosure provides a decoding method, which is used in a rewritable non-volatile memory module. The decoding method includes the following operation. A decoding circuit is activated, in which the decoding circuit supports multiple decoding modes. The decoding modes respectively correspond to a threshold value, and a distribution of the threshold value corresponds to error correction abilities of the decoding modes. First data is read from the rewritable non-volatile memory module. A first decoding operation is performed on the first data by the decoding circuit. A decoding parameter is obtained according to an execution result of the first decoding operation. A second decoding operation is performed on the first data by the decoding circuit based on a first decoding mode among the decoding modes according to a relative numerical relationship between the decoding parameter and the threshold value.

An exemplary embodiment of the disclosure further provides a memory storage device, which includes a connection interface unit, a rewritable non-volatile memory module, and a memory control circuit unit. The connection interface unit is used for coupling to a host system. The memory control circuit unit is coupled to the connection interface unit and the rewritable non-volatile memory module. The memory control circuit unit supports multiple decoding modes, the decoding modes respectively correspond to a threshold value, and a distribution of the threshold value corresponds to error correction abilities of the decoding modes. The memory control circuit unit is used for the following operation. A read command sequence is sent, which instructs to read first data from the rewritable non-volatile memory module. A first decoding operation is performed on the first data. A decoding parameter is obtained according to an execution result of the first decoding operation. A second decoding operation is performed on the first data based on a first decoding mode among the decoding modes according to a relative numerical relationship between the decoding parameter and the threshold value.

An exemplary embodiment of the disclosure further provides a memory control circuit unit for controlling a rewritable non-volatile memory module. The memory control circuit unit includes a host interface, a memory interface, a decoding circuit, and a memory management circuit. The host interface is used for coupling to the host system. The memory interface is used for coupling to the rewritable non-volatile memory module. The memory management circuit is coupled to the host interface, the memory interface, and the decoding circuit. The decoding circuit supports multiple decoding modes, the decoding modes respectively correspond to a threshold value, and a distribution of the threshold value corresponds to error correction abilities of the decoding modes. The memory management circuit unit is used for the following operation. A read command sequence is sent, which instructs to read first data from the rewritable non-volatile memory module. A first decoding operation is performed on the first data by the decoding circuit. A decoding parameter is obtained according to an execution result of the first decoding operation. The decoding circuit is instructed to perform a second decoding operation on the first data based on a first decoding mode among the decoding modes according to a relative numerical relationship between the decoding parameter and the threshold value.

Based on the above, the decoding circuit, the memory control circuit unit and/or the memory storage device proposed by the exemplary embodiments of the disclosure may support multiple decoding modes. The decoding modes respectively correspond to a threshold value, and the distribution of the threshold value corresponds to the error correction abilities of the decoding modes. After reading the first data from the rewritable non-volatile memory module, the first data may be subjected to a first decoding operation. According to the execution result of the first decoding operation, a decoding parameter may be obtained. Then, according to the relative numerical relationship between the decoding parameter and the threshold value, the first data may be subjected to a second decoding operation based on the first decoding mode of the decoding modes. Through the dynamically determined second decoding operation, a balance may be achieved between the error correction ability and decoding speed of the decoding circuit, the memory control circuit unit, and/or the memory storage device, thereby improving decoding efficiency.

BRIEF DESCRIPTION OF THE DRAWING

FIG. 9 is a schematic diagram of a parity check operation according to an exemplary embodiment of the disclosure.

DETAILED DESCRIPTION OF DISCLOSED EMBODIMENTS

In general, a memory storage device (also referred to as a memory storage system) includes a rewritable non-volatile memory module and a controller (also referred to as a control circuit). The memory storage device may be used with a host system so that the host system may write data to or read data from the memory storage device.

Figure 1:
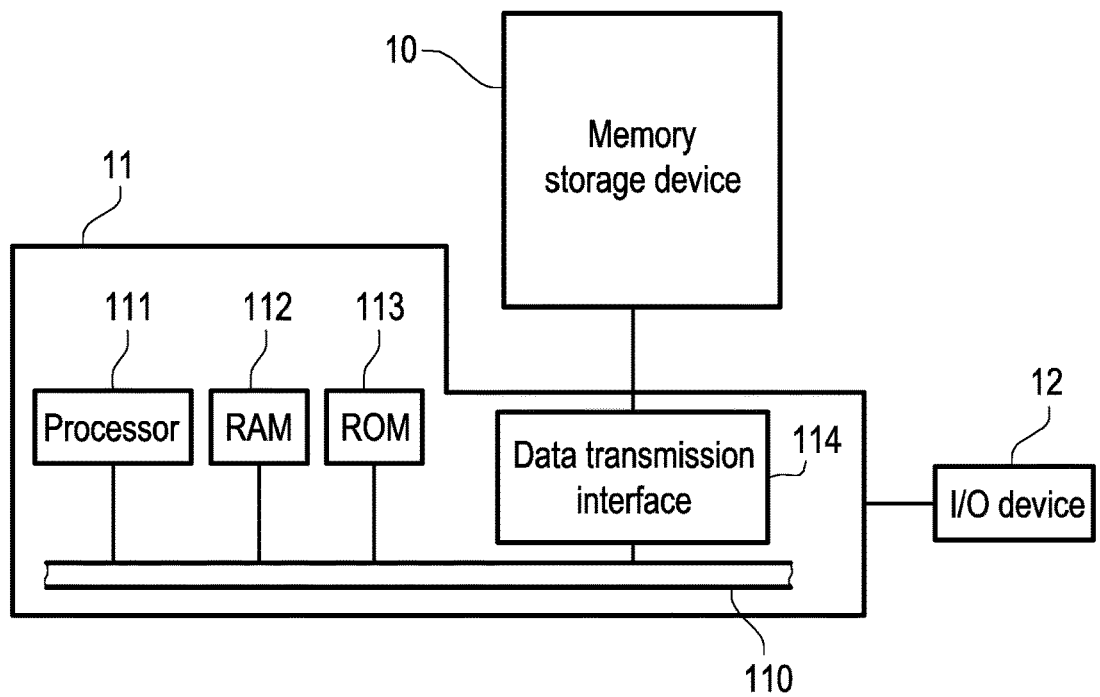
FIG. 1 is a schematic diagram of a host system, a memory storage device, and an input/output (I/O) device according to an exemplary embodiment of the disclosure.
Figure 2:
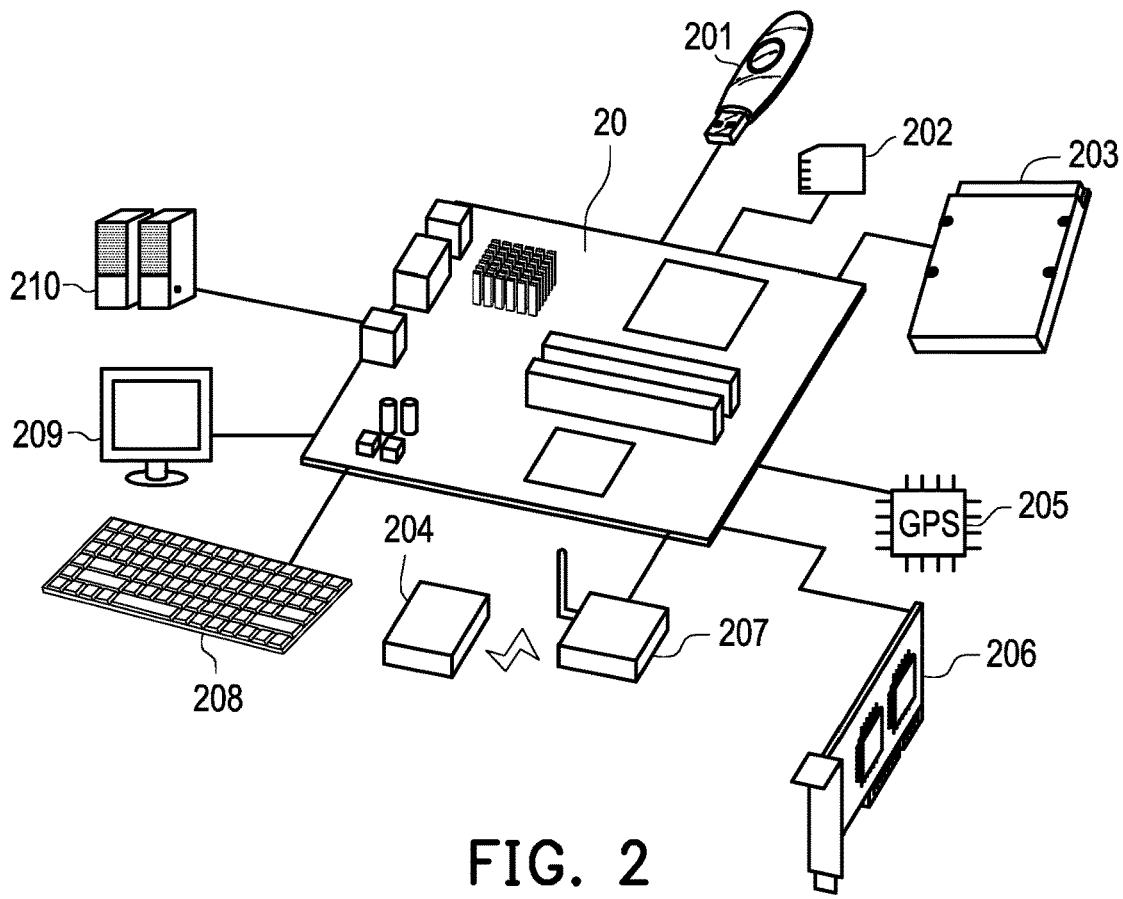
FIG. 2 is a schematic diagram of a host system, a memory storage device, and an I/O device according to an exemplary embodiment of the disclosure.

FIG. 1 is a schematic diagram of a host system, a memory storage device, and an input/output (I/O) device according to an exemplary embodiment of the disclosure. FIG. 2 is a schematic diagram of a host system, a memory storage device, and an I/O device according to an exemplary embodiment of the disclosure.

Referring to FIG. 1 and FIG. 2, a host system 11 may include a processor 111, a random access memory (RAM) 112, a read only memory (ROM) 113, and a data transmission interface 114. The processor 111, the random access memory 112, the read only memory 113, and the data transmission interface 114 may be coupled to a system bus 110.

In an exemplary embodiment, the host system 11 may be coupled to a memory storage device 10 through the data transfer interface 114. For example, the host system 11 may store data to or read data from the memory storage device 10 via the data transmission interface 114. In addition, the host system 11 may be coupled to an I/O device 12 through the system bus 110. For example, the host system 11 may transmit output signals to or receive input signals from the I/O device 12 via the system bus 110.

In an exemplary embodiment, the processor 111, the random access memory 112, the read only memory 113, and the data transmission interface 114 may be disposed on a motherboard of the host system 11. The number of the data transmission interface 114 may be one or more. The motherboard 20 may be coupled to the memory storage device 10 through the data transmission interface 114 via a wired or wireless connection.

In an exemplary embodiment, the memory storage device 10 may be, for example, a flash drive 201, a memory card 202, a solid state drive (SSD) 203, or a wireless memory storage device 204. The wireless memory storage device 204 may be a memory storage device based on various wireless communication technologies, such as a near field communication (NFC) memory storage device, a wireless fax (WiFi) memory storage device, a Bluetooth memory storage device, a low power Bluetooth memory storage device (e.g. iBeacon), etc. In addition, the motherboard may also be coupled to various I/O devices, such as a global positioning system (GPS) module 205, a network interface card 206, a wireless transmission device 207, a keyboard 208, a screen 209, a speaker 210, etc., through the system bus 110. For example, in an exemplary embodiment, the motherboard 20 may access the wireless memory storage device 204 through the wireless transmission device 207.

In an exemplary embodiment, the host system 11 is a computer system. In an exemplary embodiment, the host system 11 may be any system that may substantially cooperate with a memory storage device to store data. In an exemplary embodiment, the memory storage device 10 and the host system 11 may respectively include the memory storage device 30 and the host system 31 of FIG. 3.

Figure 3:
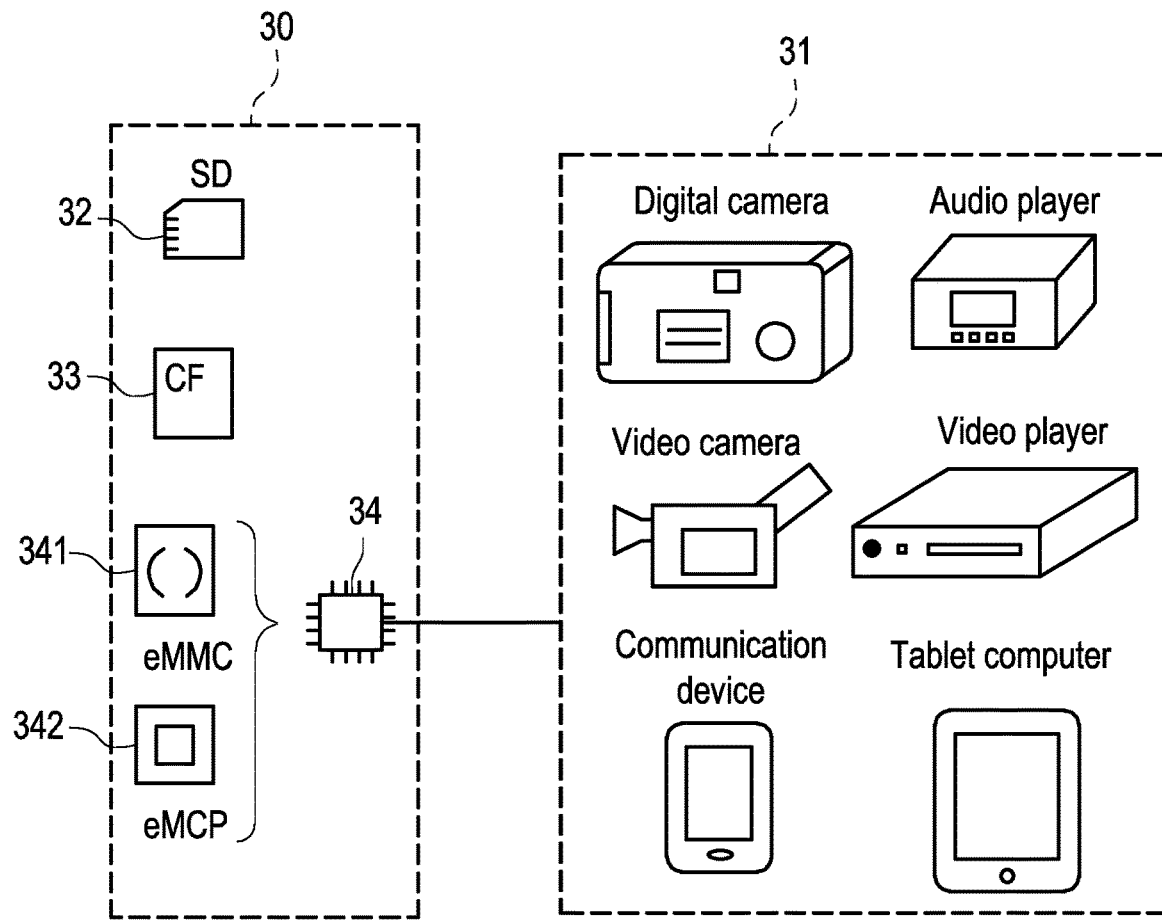
FIG. 3 is a schematic diagram of a host system and a memory storage device according to an exemplary embodiment of the disclosure.

FIG. 3 is a schematic diagram of a host system and a memory storage device according to an exemplary embodiment of the disclosure.

Referring to FIG. 3, the memory storage device 30 may be used in conjunction with the host system 31 to store data. For example, the host system 31 may be a digital camera, a video camera, a communication device, an audio player, a video player, or a tablet computer system. For example, the memory storage device 30 may be various non-volatile memory storage devices, such as a secure digital (SD) card 32, a compact flash (CF) card 33, or an embedded storage device 34, etc., used in the host system 31. The embedded storage device 34 includes various embedded storage devices that directly couple a memory module to a substrate of the host system, such as an embedded multimedia card (eMMC) 341 and/or an embedded multi-chip package (eMCP) storage device 342, etc.

Figure 4:
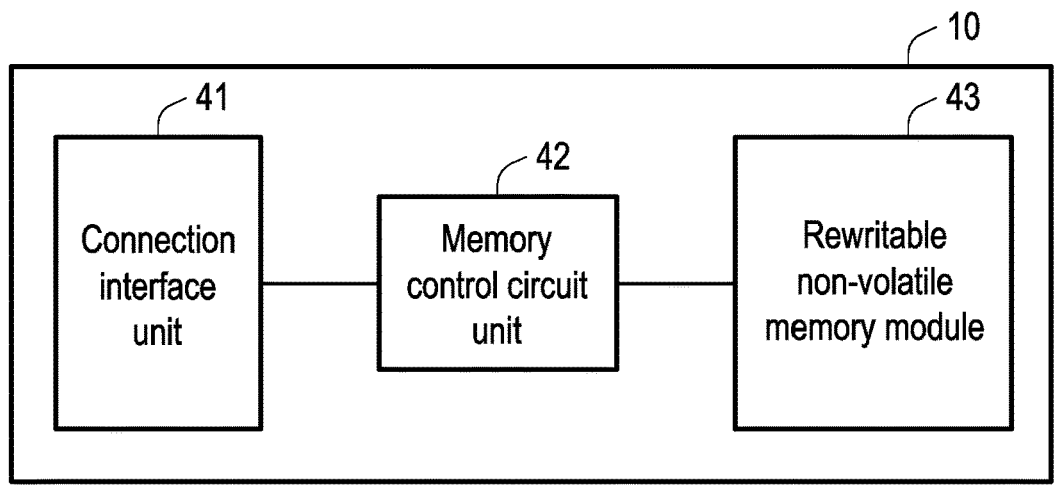
FIG. 4 is a schematic diagram of a memory storage device according to an exemplary embodiment of the disclosure.

FIG. 4 is a schematic diagram of a memory storage device according to an exemplary embodiment of the disclosure.

Referring to FIG. 4, the memory storage device 10 includes a connection interface unit 41, a memory control circuit unit 42, and a rewritable non-volatile memory module 43.

The connection interface unit 41 is used for coupling the memory storage device 10 to the host system 11. The memory storage device 10 may communicate with the host system 11 via the connection interface unit 41. In an exemplary embodiment, the connection interface unit 41 is compatible with the peripheral component interconnect express (PCI Express) standard. In an exemplary embodiment, the connection interface unit 41 may also be compliant to the serial advanced technology attachment (SATA) standard, the parallel advanced technology attachment (PATA) standard, the institute of electrical and electronics engineers (IEEE) 1394 standard, the universal serial bus (USB) standard, the SD interface standard, the ultra high speed-I (UHS-I) interface standard, the ultra high speed-II (UHS-II)

interface standard, the memory stick (MS) interface standard, the MCP interface standard, the MMC interface standard, the eMMC interface standard, the universal flash storage (UFS) interface standard, the eMCP interface standard, the CF interface standard, the integrated device electronics (IDE) standard, or other suitable standards. The connection interface unit 41 may be packaged in a chip with the memory control circuit unit 42, or the connection interface unit 41 may be disposed outside a chip including the memory control circuit unit 42.

The memory control circuit unit 42 is coupled to the connection interface unit 41 and the rewritable non-volatile memory module 43. The memory control circuit unit 42 is used to execute multiple logic gates or control commands implemented in a hardware form or a firmware form and to perform operations such as writing, reading, and erasing of data in the rewritable non-volatile memory module 43 according to the commands of the host system 11.

The rewritable non-volatile memory module 43 is used to store the data written by the host system 11. The rewritable non-volatile memory module 43 may include a single level cell (SLC) NAND-type flash memory module (i.e., a flash memory that may store 1 bit in one memory cell), multi-level cell (MLC) NAND-type flash memory module (i.e., a flash memory module that may store 2 bits in one memory cell), a triple level cell (TLC) NAND-type flash memory module (i.e., a flash memory module that may store 3 bits in one memory cell), a quad level cell (QLC) NAND-type flash memory module (i.e., a flash memory module that may store 4 bits in one memory cell), other flash memory modules, or other memory modules with the same characteristics.

Each memory cell in the rewritable non-volatile memory module 43 stores one or more bits by a change in a voltage (also referred to as a threshold voltage hereinafter). Specifically, there is a charge trapping layer between a control gate and a channel of each of the memory cells. By applying a write voltage to the control gate, the amount of electrons in the charge trapping layer may be changed, thereby changing the threshold voltage of the memory cell. This operation of changing the threshold voltage of the memory cell is also referred to as "writing data to the memory cell" or "programming the memory cell". As the threshold voltage changes, each of the memory cells in the rewritable non-volatile memory module 43 has multiple storage statuses. By applying a read voltage, it may be determined which storage status a memory cell belongs to, thereby obtaining the one or more bits stored in the memory cell.

In an exemplary embodiment, the memory cells of the rewritable non-volatile memory module 43 may constitute multiple physical programming units, and the physical programming units may constitute multiple physical erasing units. Specifically, memory cells on the same word line may form one or more physical programming units. If a memory cell may store two or more bits, the physical programming units on the same word line may be classified at least as lower physical programming units and upper physical programming units. For example, the least significant bit (LSB) of a memory cell belongs to a lower physical programming unit, and the most significant bit (MSB) of a memory cell belongs to an upper physical programming unit. Generally, in an MLC NAND flash memory, the write speed of the lower physical programming unit is greater than the write speed of the upper physical programming unit, and/or the reliability of the lower physical programming unit is higher than the reliability of the upper physical programming unit.

In the present exemplary embodiment, the physical programming unit is the minimum unit for programming. That is, the physical programming unit is the minimum unit for write data. For example, the physical programming unit may be a physical page or a physical sector. If the physical programming unit is a physical page, then the physical programming unit may include a data bit area and a redundancy bit area. The data bit area includes multiple physical sectors is used for storing user data, and the redundancy bit area is used for storing system data (e.g., management data such as error correction codes). In an exemplary embodiment, the data bit area includes 32 physical sectors, and the size of a physical sector is 512 bytes (B). However, in other exemplary embodiments, the data bit area may also include 8, 16, or a greater or lesser number of physical sectors, and the size of each of the physical sectors may also be larger or smaller. On the other hand, the physical erasing unit is the minimum unit for erasing. That is, each of the physical erasing units includes the smallest number of memory cells to be erased together. For example, the physical erasing unit is a physical block.

Figure 5:
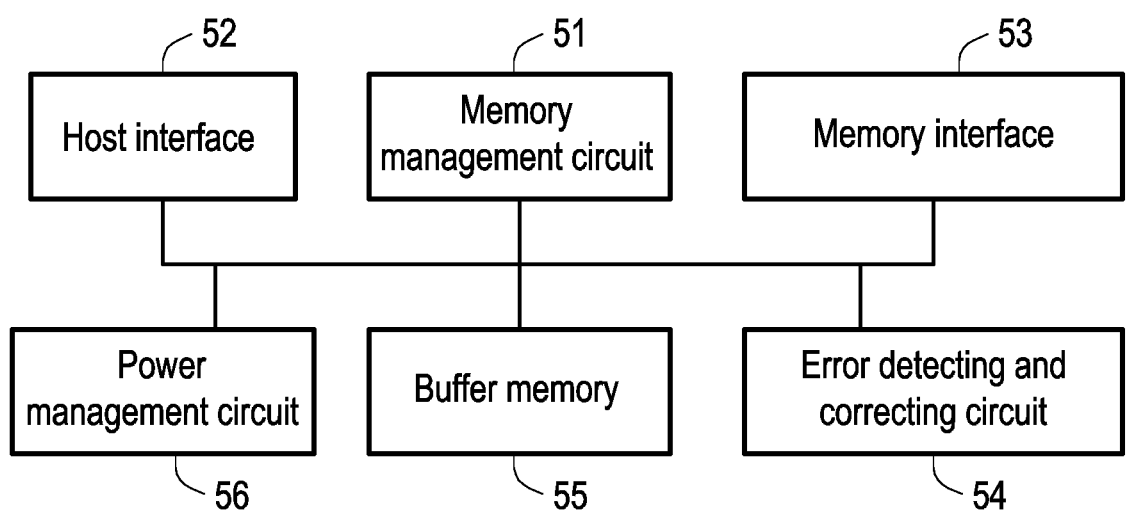
FIG. 5 is a schematic diagram of a memory control circuit unit according to an exemplary embodiment of the disclosure.

FIG. 5 is a schematic diagram of a memory control circuit unit according to an exemplary embodiment of the disclosure.

Referring to FIG. 5, the memory control circuit unit 42 includes a memory management circuit 51, a host interface 52, and a memory interface 53. The memory management circuit 51 is used to control the overall operation of the memory control circuit unit 42. Specifically, the memory management circuit 51 has multiple control commands, and when the memory storage device 10 operates, the control commands are executed to perform operations such as writing, reading, and erasing data. The following description of the operation of the memory management circuit 51 is equivalent to the description of the operation of the memory control circuit unit 42.

In an exemplary embodiment, the control commands of the memory management circuit 51 are implemented in a firmware form. For example, the memory management circuit 51 has a microprocessor unit (not shown) and a read only memory (not shown), and the control commands are programmed into the read only memory. When the memory storage device 10 operates, the control commands are executed by the microprocessor unit to perform operations such as writing, reading, and erasing data.

In an exemplary embodiment, the control commands of the memory management circuit 51 may also be stored in a specific area of the rewritable non-volatile memory module 43 (for example, a system area dedicated to storing system data in the memory module) in a program code form. In addition, the memory management circuit 51 has a microprocessor unit (not shown), a read only memory (not shown), and a random access memory (not shown). In particular, the read only memory has a boot code, and when the memory control circuit unit 42 is enabled, the microprocessor unit first executes the boot code to load the control commands stored in the rewritable non-volatile memory module 43 into the random access memory of the memory management circuit 51. Thereafter, the microprocessor unit runs these control commands to perform operations such as writing, reading, and erasing data.

In an exemplary embodiment, the control commands of the memory management circuit 51 may also be implemented in a hardware form. For example, the memory management circuit 51 includes a microcontroller, a memory cell management circuit, a memory writing circuit, a memory reading circuit, a memory erasing circuit, and a data processing circuit. The memory cell management circuit, the memory writing circuit, the memory reading circuit, the memory erasing circuit, and the data processing circuit are coupled to the microcontroller. The memory cell management circuit is used to manage the memory cells or a memory cell group of the rewritable non-volatile memory module 43. The memory writing circuit is used to issue a write command sequence to the rewritable non-volatile memory module 43 to write data into the rewritable non-volatile memory module 43. The memory reading circuit is used to issue a read command sequence to the rewritable non-volatile memory module 43 to read data from the rewritable non-volatile memory module 43. The memory erasing circuit is used to issue an erase command sequence to the rewritable non-volatile memory module 43 to erase data from the rewritable non-volatile memory module 43. The data processing circuit is used to process the data to be written into the rewritable non-volatile memory module 43 and the data read from the rewritable non-volatile memory module 43. The write command sequence, the read command sequence and the erase command sequence may respectively include one or more program codes or command codes for instructing the rewritable non-volatile memory module 43 to perform corresponding writing, reading, and erasing operations. In an exemplary embodiment, the memory management circuit 51 may also issue other types of command sequences to the rewritable non-volatile memory module 43 to instruct the rewritable non-volatile memory module 43 to perform corresponding operations.

The host interface 52 is coupled to the memory management circuit 51. The memory management circuit 51 may communicate with the host system 11 through the host interface 52. The host interface 52 may be used to receive and identify the commands and data transmitted by the host system 11. For example, the commands and data transmitted by the host system 11 may be transmitted to the memory management circuit 51 through the host interface 52. In addition, the memory management circuit 51 may transmit data to the host system 11 through the host interface 52. In this exemplary embodiment, the host interface 52 is compatible with the PCI Express standard. However, it should be understood that the disclosure is not limited thereto, and the host interface 52 may also be compatible with the SATA standard, the PATA standard, the IEEE 1394 standard, the USB standard, the SD standard, the UHS-I standard, the UHS-II standard, the MS standard, the MMC standard, the eMMC standard, the UFS standard, the CF standard, the IDE standard, or other suitable data transmission standards.

The memory interface 53 is coupled to the memory management circuit 51 and is used to access the rewritable non-volatile memory module 43. For example, the memory management circuit 51 may access the rewritable non-volatile memory module 43 through the memory interface 53. In other words, the data to be written into the rewritable non-volatile memory module 43 is converted into a format acceptable to the rewritable non-volatile memory module 43 via the memory interface 53. Specifically, if the memory management circuit 51 is to access the rewritable non-volatile memory module 43, the memory interface 53 transmits a corresponding command sequence. For example, the command sequences may include a write command sequence to instruct data writing, a read command sequence to instruct data reading, an erase command sequence to instruct data erasing, and corresponding command sequences for instructing various memory operations (e.g., changing the read voltage level, executing a garbage collection operation, etc.). These command sequences are, for example, generated by the memory management circuit 51 and transmitted to the rewritable non-volatile memory module 43 via the memory interface 53. These command sequences may include one or more signals or data on the bus. The signals or data may include command codes or program codes. For example, the read command sequence includes information such as the read identification code, the memory address, etc.

In an exemplary embodiment, the memory control circuit unit 42 further includes an error detecting and correcting circuit 54, a buffer memory 55, and a power management circuit 56.

The error detecting and correcting circuit 54 is coupled to the memory management circuit 51 and is used to execute an error detecting and correcting operation to ensure the correctness of the data. Specifically, when the memory management circuit 51 receives a write command from the host system 11, the error detecting and correcting circuit 54 generates a corresponding error correcting code (ECC) and/or error detecting code (EDC) for the data corresponding to the write command, and the memory management circuit 51 writes the data corresponding to the write command and the corresponding error correcting code and/or error detecting code to the rewritable non-volatile memory module 43. Thereafter, when the memory management circuit 51 reads data from the rewritable non-volatile memory module 43, it simultaneously reads the error correcting code and/or the error detecting code corresponding to the data, and the error detecting and correcting circuit 54 executes the error detecting and correcting operation on the read data according to the error correcting code and/or error detecting code.

The buffer memory 55 is coupled to the memory management circuit 51 and used to temporarily store data. The power management circuit 56 is coupled to the memory management circuit 51 and is used to control the power of the memory storage device 10.

In an exemplary embodiment, the rewritable non-volatile memory module 43 of FIG. 4 may include a flash memory module. In an exemplary embodiment, the memory control circuit unit 42 of FIG. 4 may include a flash memory controller. In an exemplary embodiment, the memory management circuit 51 of FIG. 5 may include a flash memory management circuit.

In an exemplary embodiment, the error detecting and correcting circuit 54 supports low-density parity-check (LDPC) codes. For example, the error detecting and correcting circuit 54 may utilize low-density parity-check codes for encoding and decoding. However, in another exemplary embodiment, the error detecting and correcting circuit 54 may also support BCH code, convolutional code, turbo code, etc., which is not limited in the disclosure.

In low-density parity-check codes, a parity-check matrix is used to define valid codewords. The parity check matrix is denoted matrix H and the codeword is denoted CW below. According to the following Equation (1), if the multiplication of the matrix H and the codeword CW is a zero vector, it means that the codeword CW is a valid codeword. In Equation (1), the operator $\otimes$ represents matrix multiplication of mod 2. In other words, the null space of matrix H contains all valid codewords. However, the disclosure does not limit the content of the codeword CW. For example, the codeword CW may also include an error correcting code or an error detecting code generated by any algorithm.

$$H \otimes CW^T = 0 \qquad \text{Equation (1)}$$

In Equation (1), the dimension of the matrix H is k-by-n, and the dimension of the codeword CW is 1-by-n, in which k and n are positive integers. The codeword CW includes message bits and parity bits. For example, the codeword CW may be represented as [M P], where vector M is formed of message bits and vector P is formed of parity bits. The dimension of vector M is 1-by-(n−k), while the dimension of vector P is 1-by-k. Hereinafter, the message bits and the parity bits are collectively referred to as data bits. In other words, there are n data bits in the codeword CW. In the codeword CW, the length of the message bits is (n−k) bits, the length of the parity bits is k bits, and the code rate of the codeword CW is (n−k)/n.

In general, a generator matrix (denoted as G below) is used in encoding, so that the following Equation (2) may be satisfied for any vector M. For example, the dimension of the generator matrix G is (n−k)-by-n.

$$M \otimes G = [M\ P] = CW \qquad \text{Equation (2)}$$

The codeword CW generated by Equation (2) is a valid codeword. Therefore, Equation (2) may be substituted into Equation (1), thereby obtaining Equation (3) below.

$$H \otimes G^T \otimes M^T = 0 \qquad \text{Equation (3)}$$

Since the vector M may be any vector, the following Equation (4) must be satisfied. That is to say, after the matrix H (i.e., the parity check matrix) is determined, the corresponding generator matrix G may also be determined.

$$H \otimes G^T = 0 \qquad \text{Equation (4)}$$

When decoding a codeword CW, a parity check operation is first performed on the data bits in the codeword CW, such as multiplying the matrix H by the codeword CW to generate a vector (denoted as S below, as shown in the following Equation (5)). The vector S is also called the syndrome vector. If the vector S is a zero vector, the codeword CW may be directly output. If the vector S is not a zero vector, it means that the codeword CW is not a valid codeword.

$$H \otimes CW^T = S \qquad \text{Equation (5)}$$

The dimension of the vector S is k-by-1. Each element in the vector S is also called a syndrome. If codeword CW is not a valid codeword, the error detecting and correcting circuit 54 may attempt to correct errors (i.e., erroneous bits) in codeword CW through decoding operations.

Figure 6:
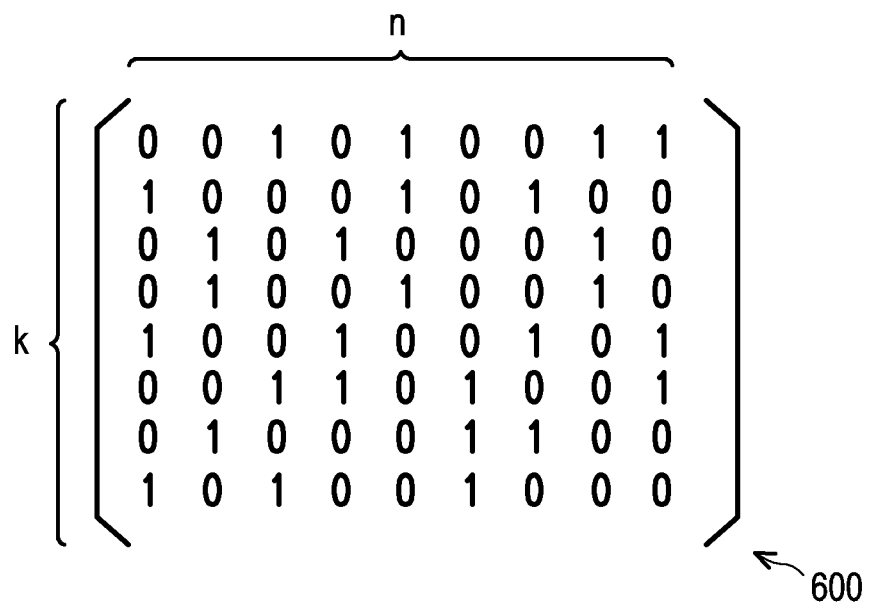
FIG. 6 is a schematic diagram of a parity check matrix according to an exemplary embodiment of the disclosure.

FIG. 6 is a schematic diagram of a parity check matrix according to an exemplary embodiment of the disclosure.

Referring to FIG. 6, the dimension of the parity check matrix 600 is k-by-n. For example, k is 8 and n is 9. However, the disclosure does not limit the values of the positive integers k and n. Each row of the parity check matrix 600 may represent a constraint. Taking the first row of the parity check matrix 600 as an example, if a certain codeword is a valid codeword, then the bit "0" is obtained after a mod 2 addition is performed to the 3rd, 5th, 8th, and 9th bits in the codeword. Those skilled in the art should be able to understand how to use the parity check matrix 600 for encoding and decoding, and details are omitted herein. In addition, the parity check matrix 600 is only an example matrix and is not intended to limit the disclosure. When the memory management circuit 51 is to store data (including multiple bits) in the rewritable non-volatile memory module 43, the error detecting and correcting circuit 54 may generate k parity bits corresponding to every (n−k) bits (i.e., message bits) in the data. Next, the memory management circuit 51 may write the n bits (i.e., data bits) into the rewritable non-volatile memory module 43 as a codeword.

Figure 7:
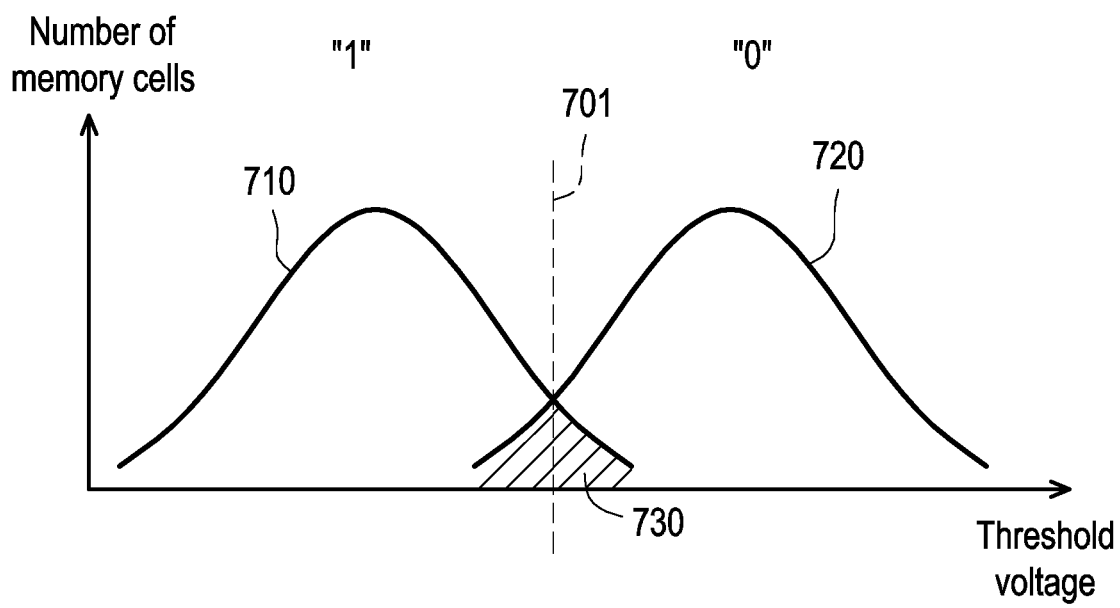
FIG. 7 is a schematic diagram of a threshold voltage distribution of a memory cell according to an exemplary embodiment of the disclosure.

FIG. 7 is a schematic diagram of a threshold voltage distribution of a memory cell according to an exemplary embodiment of the disclosure.

Referring to FIG. 7, the horizontal axis represents the threshold voltage of the memory cells, and the vertical axis represents the number of memory cells. For example, FIG. 7 may represent the threshold voltage of each memory cell in one physical unit (also referred to as the first physical unit). For example, the first physical unit may include one or more physical programming units.

Assuming that the status 710 corresponds to the bit "1" and the status 720 corresponds to the bit "0", then when the threshold voltage of a certain memory cell belongs to the status 710, the memory cell stores the bit "1"; conversely, if the threshold voltage of a certain memory cell belongs to the status 720, the memory cell stores the bit "0". It should be noted that, in this exemplary embodiment, one status in the threshold voltage distribution corresponds to one bit value, and the threshold voltage distribution of the memory cell has two possible statuses. However, in other exemplary embodiments, each status in the threshold voltage distribution may also correspond to multiple bit values, and the threshold voltage distribution of the memory cells may also have four, eight, or any number of other statuses. Furthermore, the disclosure does not limit the bits represented by each status. For example, in another exemplary embodiment of FIG. 7, the status 710 may also correspond to bit "0", and the status 720 may correspond to bit "1".

When data is to be read from the rewritable non-volatile memory module 43, the memory management circuit 202 may send a read command sequence to the rewritable non-volatile memory module 43. The read command sequence is used to instruct the rewritable non-volatile memory module 43 to read at least one memory cell (also referred to as the first memory cell) in the first physical unit using at least one read voltage level to obtain the data stored in the first memory cell. For example, according to the read command sequence, the rewritable non-volatile memory module 43 may use the read voltage level 701 in FIG. 7 to read the first memory cell. If the threshold voltage of one of the first memory cells is lower than the read voltage level 701, this memory cell may be turned on, and the memory management circuit 51 may read the bit "1". Alternatively, if the threshold voltage of one of the first memory cells is greater than the read voltage level 701, this memory cell may not be turned on, and the memory management circuit 51 may read the bit "0". The read bit data may form one or more codewords.

In an exemplary embodiment, an overlap region 730 (denoted with diagonal lines in FIG. 7) is included between the status 710 and the status 720. The overlap region 730 represents that some memory cells in the first memory cell should store the bit "1" (belonging to the status 710), but their threshold voltage is greater than the applied read voltage level 701; also, some memory cells in the first memory cell should store the bit "0" (belonging to the status 720), but their threshold voltage is lower than the applied read voltage level 701. In other words, in the data read by applying the read voltage level 701, some bits may have errors.

In general, if the usage time of the first memory cell is very short (e.g., the data is not stored in the first memory cell for a long time) and/or the usage frequency of the first memory cell is very low (e.g., the read count, write count, and/or erase count of the first memory cell is not high), the overlap region 730 is usually small, and there may even be no overlap region 730 (i.e., the statuses 710 and 720 do not overlap). Alternatively, if the memory storage device 10 has just left the factory, the overlap region 730 usually does not exist. If the area of the overlap region 730 is small, there may be less erroneous bits in the data read from the first memory cell by applying the read voltage level 701.

However, as the usage time and/or usage frequency of the rewritable non-volatile memory module 43 increases, the area of the overlap region 730 may gradually increase. For example, if the usage time of the first memory cell is long (e.g., data is stored in the first memory cell for a long time) and/or the usage frequency of the first memory cell is high (e.g., the read count, write count, and/or erase count of the first memory cell is high), the area of overlap region 730 may increase (e.g., the statuses 710 and 720 may become flatter and/or the statuses 710 and 720 may be closer to each other). If the area of the overlap region 730 is large, there may be more erroneous bits in the data read from the first memory cell by applying the read voltage level 701. Therefore, after receiving the read data from the rewritable non-volatile memory module 43, the error detecting and correcting circuit 54 may perform a parity check operation in the decoding operation to verify whether there is an error in the data. If it is determined that there are errors in the data, the error detecting and correcting circuit 54 may correct the errors in the data through the decoding operation.

In an example embodiment, the error detecting and correcting circuit 54 may perform an iterative decoding operation. An iterative decoding operation may be used to decode a piece of data from the rewritable non-volatile memory module 43. For example, one decoding unit in the data may be one codeword. In an iterative decoding operation, the parity check operation for detecting the correctness of the data and the decoding operation for correcting errors in the data may be repeated and alternately performed until successful decoding or the number of iterations reaches a predetermined number. If the number of iterations reaches the predetermined number, the error detecting and correcting circuit 54 may determine that the decoding fails. In addition, if it is determined through the parity check operation that there is no error in a certain data, the error detecting and correcting circuit 54 may determine that the decoding is successful and output the successfully decoded data.

Figure 8:
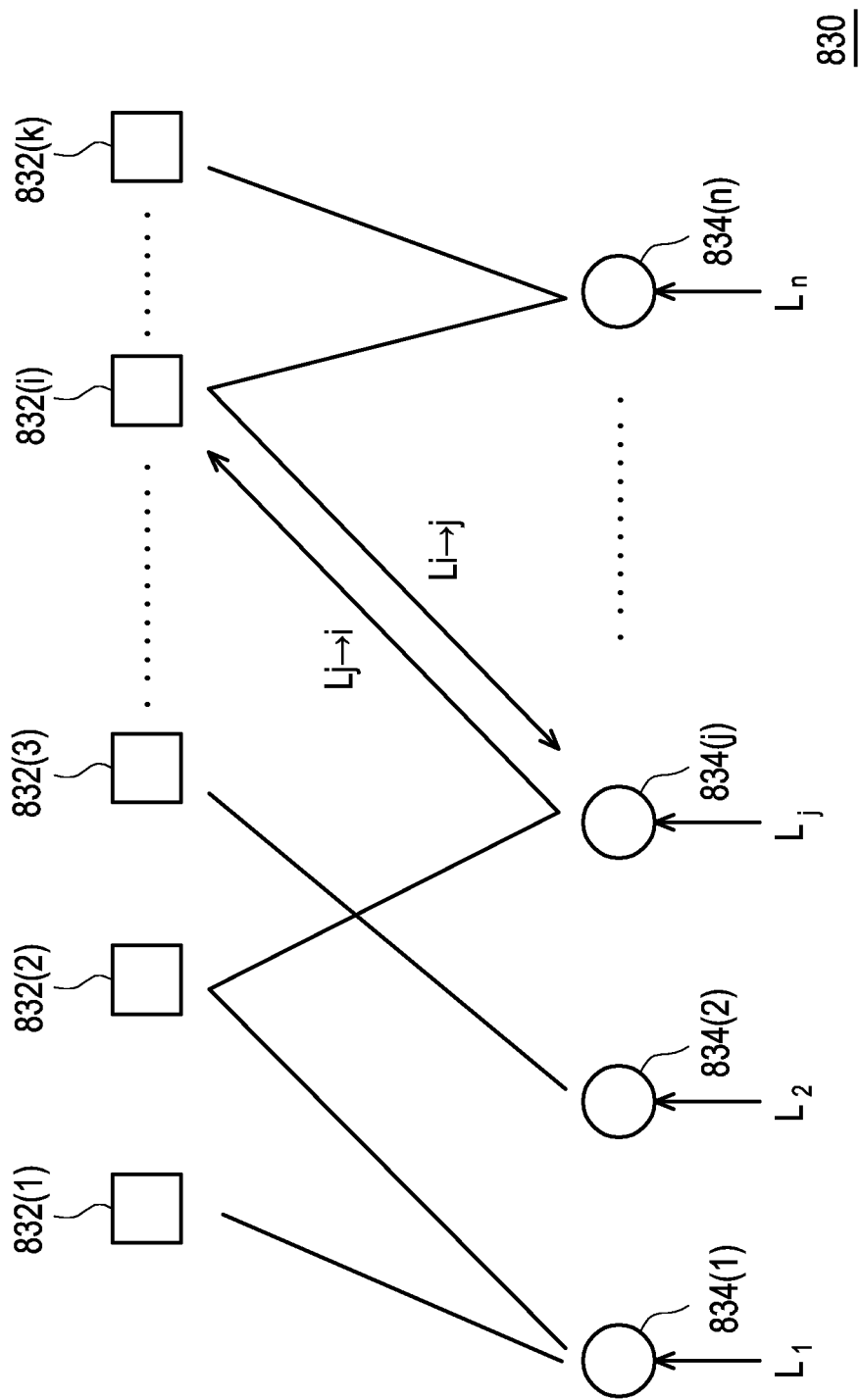
FIG. 8 is a schematic diagram of a bipartite graph according to an exemplary embodiment of the disclosure.

FIG. 8 is a schematic diagram of a bipartite graph according to an exemplary embodiment of the disclosure.

Referring to FIG. 8, in general, the parity check matrix H may be represented as a bipartite graph 830, which includes parity nodes 832(1) to 832(k) and message nodes 834(1) to 834(n). Each parity node 832(1) to 832(k) corresponds to a syndrome, and each message node 834(1) to 834(n) corresponds to a data bit. The corresponding relationship between data bits and syndromes (i.e., the connection between the message nodes 834(1) to 834(n) and the parity nodes 832(1) to 832(k)) is generated according to the matrix H. Specifically, if the element in the $i^{th}$ row and the $j^{th}$ column of the matrix H is 1, the $i^{th}$ parity node 832(i) is connected to the $j^{th}$ message node 834(j), where i and j are a positive integers.

When the memory management circuit 51 reads n data bits (forming a codeword) from the rewritable non-volatile memory module 43, the memory management circuit 51 also obtains the reliability information of each data bit (also known as the channel reliability information). The reliability information is used to represent the probability (or referred to as confidence) that the corresponding data bit is decoded as a bit "1" or "0". In the bipartite graph 830, the message nodes 834(1) to 834(n) also receive the corresponding reliability information. For example, the message node 834(1) receives the reliability information $L_1$ of the first data bit, and the message node 834(j) receives the reliability information $L_j$ of the $j^{th}$ data bit.

The error detecting and correcting circuit 54 may perform decoding operations according to the structure and reliability information $L_1$ to $L_n$ of the bipartite graph 830. For example, the decoding operation may include iterative decoding. In iterative decoding, the message nodes 834(1) to 834(n) calculates and sends the reliability information to the parity nodes 832(1) to 832(k), and the parity nodes 832(1) to 832(k) also calculates and sends the reliability information to the message nodes 834(1) to 834(n). The reliability information is transmitted along the edges in the bipartite graph 830. For example, the parity node 832(i) transmits reliability information to the message node 834(j), and the message node 834(j) transmits reliability information to the parity node 832(i). The reliability information is used to represent that the probability (i.e., confidence) of a node that a certain data bit is decoded as "1" or "0". For example, the reliability information represents the confidence (which may be positive or negative) of the $i^{th}$ data bit as being decoded as "1" or "0" by the message node 834(j), and the reliability information represents the confidence of the $j^{th}$ data bit as being decoded being decoded as "1" or "0" by the parity node 832(i). In addition, the message nodes 834(1) to 834(n) and the parity nodes 832(1) to 832(k) may calculate the output reliability information according to the input reliability information, which approximates to the conditional probability of a data bit being decoded as "1" or "0". Therefore, the above process of transmitting reliability information is also referred to as belief propagation.

After performing a parity check operation on the calculated data bits (e.g., multiplying a codeword formed by the data bits by a parity check matrix), it may be determined whether the codeword is a valid codeword. If the generated codeword is a valid codeword, it means that the decoding is successful. However, if the generated codeword is not a valid codeword, the next iteration may be performed. If the number of iterations of the iterative decoding reaches a preset value, it means that the decoding fails.

In an exemplary embodiment, the reliability information includes a log likelihood ratio (LLR). For example, the reliability information $L_1$ to $L_n$, $L_{i \to j}$, and $L_{j \to i}$ in FIG. 8 may respectively be a log likelihood ratio. In general, the larger the absolute value of the log likelihood ratio (which may be positive or negative) corresponding to a data bit, the higher the reliability of the data bit, therefore, the higher the probability that the current bit value of this data bit is considered correct. Conversely, the smaller the absolute value of the log likelihood ratio corresponding to a certain data bit, the lower the reliability of the data bit, therefore, the higher the probability that the current bit value of this data bit is considered erroneous and may be corrected in the current iterative decoding. In an exemplary embodiment, reliability information (e.g., log likelihood ratio) used in iterative decoding is obtained by a look-up table. However, in another exemplary embodiment, the reliability information used in the iterative decoding may also be dynamically calculated and generated according to a specific algorithm in the iterative decoding. In addition, based on different algorithms, the message nodes 834(1) to 834(n) and/or the parity nodes 832(1) to 832(k) may also calculate different types of reliability information, which is not limited to the log likelihood ratio.

FIG. 9 is a schematic diagram of a parity check operation according to an exemplary embodiment of the disclosure.

Referring to FIG. 9, assuming that the data read from the first memory cell includes the codeword 901, in the parity check operation, according to Equation (5), the matrix 900 (i.e., the parity check matrix) may be multiplied by the codeword 901 to produce a vector 902 (i.e., vector S). The vector 902 is also referred to as a syndrome vector.

Each bit in the codeword 901 corresponds to at least one element (i.e., a syndrome) in vector 902. For example, a bit V0 (corresponding to the first column in the parity check matrix 900) in the codeword 901 corresponds to syndromes S1, S4, and S7; a bit V1 (corresponding to the second column in the parity check matrix 900) corresponds to syndromes S2, S3, and S6; by analogy, a bit V8 (corresponding to the ninth column in the parity check matrix 900) corresponds to syndromes S0, S4, and S5. If the bit V0 is an error bit, at least one of syndromes S1, S4, and S7 may be "1". If the bit V1 is an error bit, at least one of syndromes S2, S3, and S6 may be "1". By analogy, if the bit V8 is an error bit, at least one of the syndromes S0, S4, and S5 may be "1".

In other words, if the syndromes S0 to S7 are all "0", it means that there may be no error bits in the codeword 901, so the error detecting and correcting circuit 54 may directly output the codeword 901. However, if the codeword 901 has at least one erroneous bit, at least one of the syndromes S0 to S7 may be "1", and the error detecting and correcting circuit 54 may correct the error by performing decoding operations on the codeword 901.

In an exemplary embodiment, the memory management circuit 51 may activate the circuit (also referred to as the decoding circuit) in the error detecting and correcting circuit 54 responsible for performing the decoding operation. In particular, the decoding circuit may support multiple decoding modes, and the error correction abilities of the decoding modes are different.

In an exemplary embodiment, the memory management circuit 51 may send a read command sequence (also referred to as a first read command sequence) to the rewritable non-volatile memory module 43. The first read command sequence may instruct the rewritable non-volatile memory module 43 to use a certain read voltage level (also referred to as the first read voltage level) to read target data (also referred to as the first data) from the first physical unit. For example, the first read voltage level may include the read voltage level 701 in FIG. 7. According to the first read command sequence, the rewritable non-volatile memory module 43 may use the first read voltage level to read the first data from the first physical unit and return the read first data to the memory management circuit 51.

After receiving the first data returned from the rewritable non-volatile memory module 43, the memory management circuit 51 may instruct the decoding circuit to perform a decoding operation (also referred to as a first decoding operation) on the first data. For example, the memory management circuit 51 may instruct the decoding circuit to perform the first decoding operation based on a certain decoding mode (also referred to as a preset decoding mode) in an attempt to correct errors in the first data.

In an example embodiment, the first decoding operation performed based on the preset decoding mode may include hard bit mode decoding. For example, in the hard bit mode decoding, the decoding circuit may adopt a bit flipping algorithm, a min-sum algorithm, and/or a sum-product algorithm to decode the first data in an attempt to correct errors in the first data. Those skilled in the art should know how to use LDPC decoding algorithms such as the bit flipping algorithm, the min-sum algorithm, and/or the sum-product algorithm to decode data, and details are not described herein.

If all errors in the first data are corrected, the memory management circuit 51 may determine that the decoding is successful and output the successfully decoded data. However, if some errors in the first data cannot be corrected, the memory management circuit 51 may adjust the read voltage level (i.e., the first read voltage level) used to read the first physical unit and send a read command sequence to the rewritable non-volatile memory module 43 according to the adjusted read voltage level to instruct the rewritable non-volatile memory module 43 to use the adjusted read voltage level to read the first physical unit again to obtain the first data again. Then, the memory management circuit 51 may again instruct the decoding circuit to perform the first decoding operation based on the preset decoding mode, so as to attempt to correct errors in the first data.

In an exemplary embodiment, the memory management circuit 51 may determine whether the number of executions of the first decoding operation reaches a preset value. If the number of executions of the first decoding operation does not reach the preset value, the memory management circuit 51 may allow the decoding circuit to continue to decode the first data based on the preset decoding mode. However, if the number of executions of the first decoding operation has reached a preset value, the memory management circuit 51 may instruct the decoding circuit to attempt to decode the data (i.e., the first data) read from the first physical unit based on another decoding mode (also referred to as the first decoding mode). It should be noted that the first decoding mode is different from the preset decoding mode. For example, the error correction ability of the first decoding mode is higher than that of the preset decoding mode.

In an exemplary embodiment, before entering the first decoding mode, the memory management circuit 51 may further perform an optimal read voltage level search operation to attempt to optimally adjust the read voltage level (e.g., the read voltage level 701 in FIG. 7) for reading the first physical unit. Those skilled in the art should know how to perform the optimal read voltage level search operation to adjust the read voltage level, and details are not described herein.

In an exemplary embodiment, after entering the first decoding mode, the memory management circuit 51 may send a read command sequence (also referred to as a second read command sequence) to the rewritable non-volatile memory module 43. The second read command sequence may instruct the rewritable non-volatile memory module 43 to use multiple read voltage levels (also referred to as second read voltage levels) to read target data (i.e., the first data) and the auxiliary data (also referred to as soft bit information) from the first physical unit. The soft bit information may be used to assist in decoding the first data, so as to improve the decoding success rate of the first data.

Figure 10:
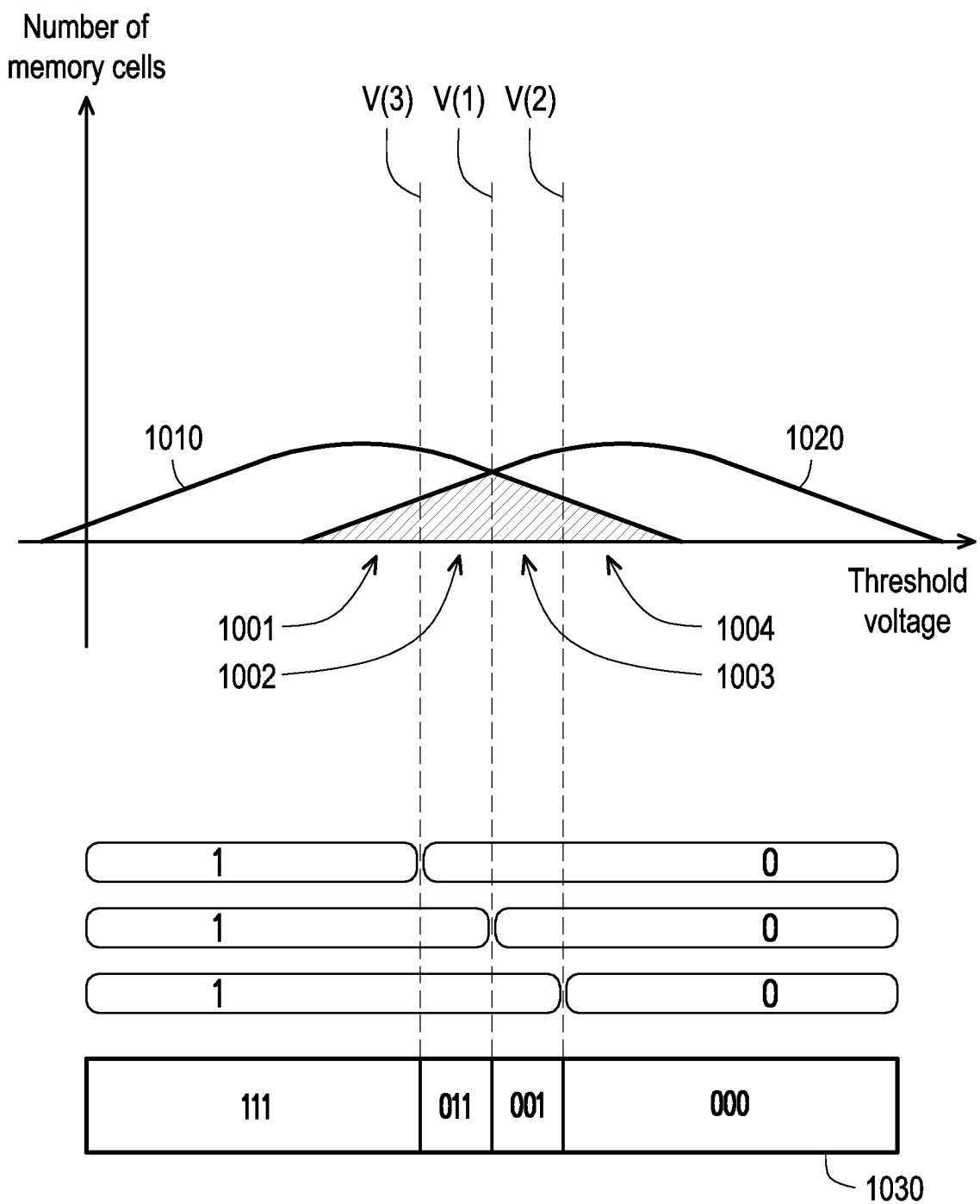
FIG. 10 is a schematic diagram of reading soft bit information according to an exemplary embodiment of the disclosure.

FIG. 10 is a schematic diagram of reading soft bit information according to an exemplary embodiment of the disclosure.

Referring to FIG. 10, in an exemplary embodiment, the second read voltage levels include read voltage levels V(1) to V(3). According to the second read command sequence, the rewritable non-volatile memory module 43 may sequentially use the read voltage levels V(1) to V(3) to read the first physical unit to obtain the first data and the soft bit information 1030 corresponding to the first data. For example, one of the read voltage levels V(1) to V(3) (e.g., the read voltage level V(1)) may be used to read the first data, and the read voltage levels V(1) to V(3) may be used together to obtain the soft bit information 1030.

In an exemplary embodiment, the read voltage levels V(1) to V(3) may be divided into voltage intervals 1001 to 1004, as shown in FIG. 10. Assuming that the threshold voltage distribution of the memory cells in the first physical unit includes the statuses 1010 and 1020, the soft bit information 1030 may reflect that the voltage interval in which the threshold voltage of each memory cell in the first physical unit is located is one of the voltage intervals 1001 to 1004. For example, assuming that the soft bit information 1030 read from a certain memory cell using the read voltage levels V(1) to V(3) is "011", it means that the threshold voltage of this memory cell is in the voltage interval 1002, so on and so forth.

Figure 11:
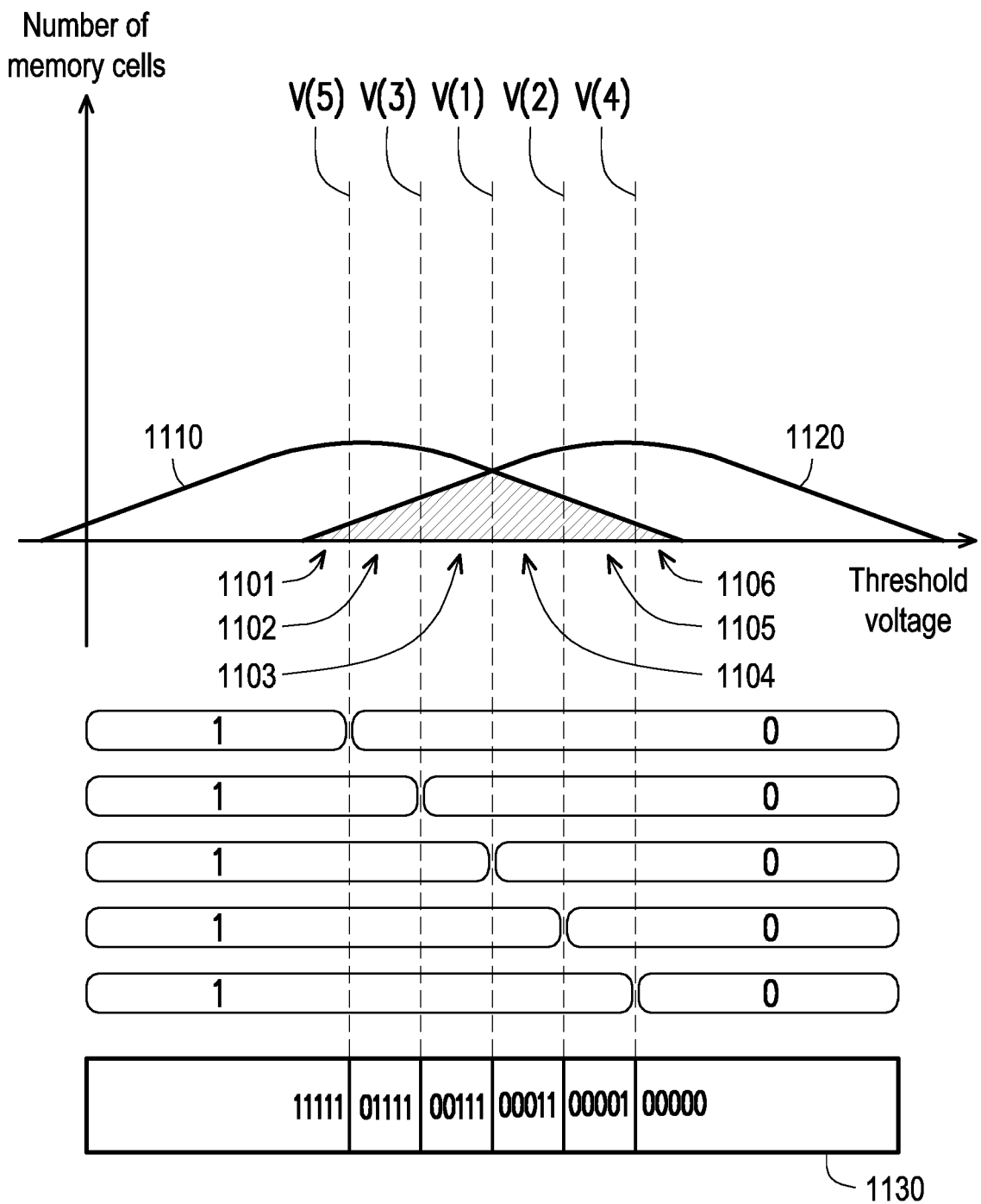
FIG. 11 is a schematic diagram of reading soft bit information according to an exemplary embodiment of the disclosure.

FIG. 11 is a schematic diagram of reading soft bit information according to an exemplary embodiment of the disclosure.

Referring to FIG. 11, in an exemplary embodiment, the second read voltage levels include read voltage levels V(1) to V(5). It should be noted that the total number of read voltage levels V(1) to V(5) in FIG. 11 (i.e., 5) is more than the total number of read voltage levels V(1) to V(3) in FIG. 10 (i.e., 3). According to the second read command sequence, the rewritable non-volatile memory module 43 may sequentially use the read voltage levels V(1) to V(5) to read the first physical unit to obtain the first data and the soft bit information 1130 corresponding to the first data. For example, one of the read voltage levels V(1) to V(5) (e.g., the read voltage level V(1)) may be used to read the first data, and the read voltage levels V(1) to V(5) may be used together to obtain the soft bit information 1130.

In an exemplary embodiment, the read voltage levels V(1) to V(5) may be divided into voltage intervals 1101 to 1106, as shown in FIG. 11. Assuming that the threshold voltage distribution of the memory cells in the first physical unit includes the statuses 1110 and 1120, the soft bit information 1130 may reflect that the voltage interval in which the threshold voltage of each memory cell in the first physical unit is located is one of the voltage intervals 1101 to 1106. For example, assuming that the soft bit information 1130 read from a certain memory cell using the read voltage levels V(1) to V(5) is "00111", it means that the threshold voltage of this memory cell is in the voltage interval 1103, so on and so forth.

It should be noted that, in general, as shown in FIG. 10 and FIG. 11, the decoding success rate of decoding the first data using the soft bit information 1130 of FIG. 11 may be higher than the decoding success rate of decoding the first data using the soft bit information 1030 of FIG. 10. In addition, more read voltage levels may also be used to read the first physical unit to increase the resolution of the divided voltage intervals (i.e., increase the total number of voltage intervals 1101 to 1106), thereby further improving the success rate of subsequent decoding.

After receiving the first data and the soft bit information returned from the rewritable non-volatile memory module 43, the memory management circuit 51 may instruct the decoding circuit to perform a decoding operation (also referred to as a second decoding operation) on the first data. For example, the memory management circuit 51 may instruct the decoding circuit to perform the second decoding operation based on the first decoding mode.

In an example embodiment, the second decoding operation performed based on the first decoding mode may include soft bit mode decoding. For example, in the soft bit mode decoding, the decoding circuit may also adopt a bit flipping algorithm, a min-sum algorithm, and/or a sum-product algorithm to decode the first data in an attempt to correct errors in the first data. It should be noted that in the soft bit mode decoding, the memory management circuit 51 may update the reliability information (e.g., log likelihood ratio) according to the soft bit information (e.g., the soft bit information 1030 in FIG. 10 or the soft bit information 1130 in FIG. 11). Then, the decoding circuit may decode the first data according to the updated reliability information. Those skilled in the art should know how to update the reliability information (e.g., the log likelihood ratio) according to the soft bit information, and details are not described herein. In particular, compared with using fixed or preset reliability information to decode the first data in the hard bit decoding mode, using the dynamically updated reliability information to decode the first data in the soft bit mode decoding may effectively improve the decoding success rate of the first data. However, compared with the hard bit decoding mode, it takes a longer time to perform the decoding operation based on the soft bit decoding mode.

Figure 12:
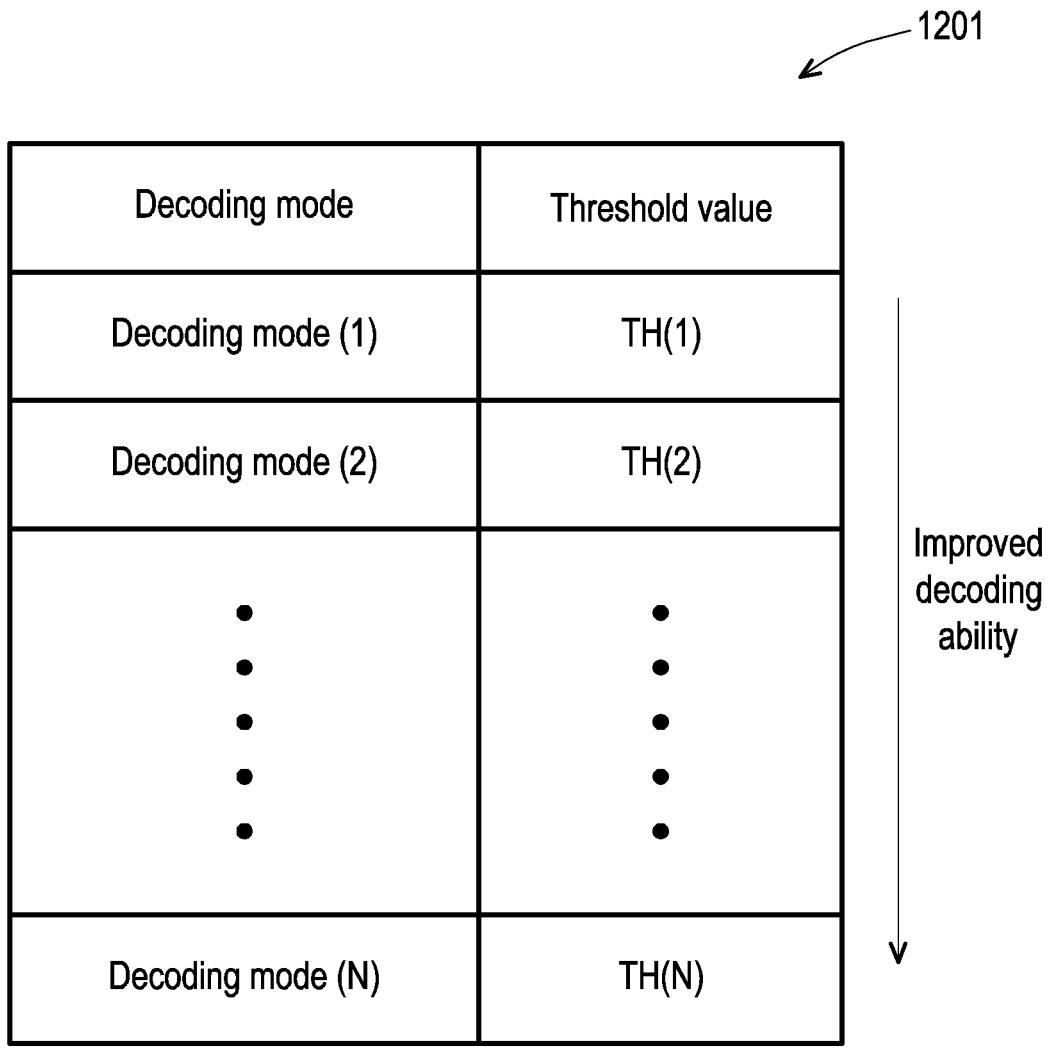
FIG. 12 is a schematic diagram of different decoding modes corresponding to different threshold values according to an exemplary embodiment of the disclosure.

FIG. 12 is a schematic diagram of different decoding modes corresponding to different threshold values according to an exemplary embodiment of the disclosure.

Referring to FIG. 12, assuming that the decoding modes supported by the decoding circuit include the decoding mode (1) to the decoding mode (N). The memory management circuit 51 may respectively configure threshold values TH(1) to TH(N) for the decoding mode (1) to the decoding mode (N). The decoding mode (i) corresponds to the threshold value TH(i). The memory management circuit 51 may record the corresponding relationship or mapping relationship between the decoding mode (1) to the decoding mode (N) and the threshold values TH(1) to TH(N) in the table information 1201.

It should be noted that the distribution of the threshold values TH(1) to TH(N) (i.e., the distribution of the numerical magnitude of the threshold values TH(1) to TH(N)) may correspond to or reflect the error correction abilities (i.e., the decoding abilities) of the decoding mode (1) to the decoding mode (N). Taking FIG. 12 as an example, the threshold values TH(1) to TH(N) gradually increase, meaning that the decoding abilities of the decoding mode (1) to the decoding mode (N) gradually increase. That is, in the decoding mode (1) to the decoding mode (N), the decoding ability of the decoding mode (p) is higher than that of decoding mode (j), in which p is greater than j, and the threshold value TH(p) is greater than the threshold value TH(j). Taking FIG. 10 and FIG. 11 as examples, the second decoding operation performed based on the decoding mode (j) may include decoding the first data using the soft bit information 1030 in FIG. 10, and the second decoding operation performed based on the decoding mode (p) may include decoding the first data using the soft bit information 1130 in FIG. 11, so as to improve the decoding success rate. In addition, more different technical means may be used to improve the decoding ability of the second decoding operation, such as further increasing the total number of read voltage levels V(1) to V(5) in FIG. 11 or instructing the rewritable non-volatile memory module 43 through a customized command to read data based on different reliability, etc., which is not limited in the disclosure.

In an exemplary embodiment, before performing the second decoding operation, the memory management circuit 51 may obtain a decoding parameter according to the execution result of the first decoding operation. The decoding parameter is related to the bit error rate of the first data. For example, the numerical magnitude of the decoding parameter may be positively related to the bit error rate of the first data. That is, when the value of the decoding parameter is larger, it means that the bit error rate of the first data is higher.

In an exemplary embodiment, the memory management circuit 51 may obtain a syndrome vector (i.e., the vector S) according to the execution result of the first decoding operation. This syndrome vector may include multiple syndromes. The memory management circuit 51 may obtain the decoding parameter according to the sum of the syndromes. For example, the sum of the syndromes may correspond to, reflect, or be positively related to the bit error rate of the first data.

Taking FIG. 9 as an example, in an exemplary embodiment, after the first decoding operation fails and/or the optimal read voltage level search operation is performed, the memory management circuit 51 may send a read command sequence to the rewritable non-volatile memory module 43. The read command sequence may instruct the rewritable non-volatile memory module 43 to read at least one memory cell in the first physical unit using at least one read voltage level to obtain the codeword 901. The decoding circuit may perform a parity check operation on the codeword 901 to obtain the vector 902. The memory management circuit 51 may calculate the sum of the syndromes S0 to S7 in the vector 902 and obtain the decoding parameter according to the sum. For example, the value of the decoding parameter may be the same or positively related to the sum of the syndromes S0 to S7.

After obtaining the decoding parameter, according to the relative numerical relationship between the decoding parameter and the threshold values TH(1) to TH(N), the memory management circuit 51 may instruct the decoding circuit to perform a second decoding operation on the first data based on a specific decoding mode (i.e., the first decoding mode) among the decoding mode (1) to the decoding mode (N). For example, the memory management circuit 51 may compare the decoding parameter with at least one of the threshold values TH(1) to TH(N). Then, the memory management circuit 51 may determine the first decoding mode from the decoding mode (1) to the decoding mode (N) according to the comparison result.

In an exemplary embodiment, in response to the decoding parameter being less than the threshold value TH(k) (also referred to as the first threshold value), the memory management circuit 51 may instruct the decoding circuit to perform a second decoding operation on the first data based on the decoding mode (k) (i.e., the first decoding mode) corresponding to the threshold value TH(k). In an exemplary embodiment, the decoding parameter is less than the threshold value TH(k), meaning that the second decoding operation performed based on the decoding mode (k) has a high probability to correct all the errors in the first data. Therefore, when the decoding parameter is less than the threshold value TH(k), decoding the first data based on the decoding mode (k) facilitates improving the decoding success rate of the first data.

In an exemplary embodiment, in response to the decoding parameter being not less than the threshold value TH(s) (also referred to as the second threshold value), the memory management circuit 51 may instruct the decoding circuit to skip the decoding mode (s) (also referred to as the second decoding mode) corresponding to the threshold value TH(s). Skipping the decoding mode (s) means that the second decoding operation is not performed based on the decoding mode (s). For example, assuming the value of the decoding parameter is between the threshold value TH(s) and TH(k), k is greater than s (e.g., k is equal to s+1), and the threshold value TH(k) is greater than the threshold value TH(s). In this case, the memory management circuit 51 may skip the decoding mode (s) with relatively low error correction ability and directly instruct the decoding circuit to perform the second decoding operation based on the decoding mode (k) with relatively high error correction ability.

It should be noted that, in an exemplary embodiment, the decoding parameter is not less than the threshold value TH(s), meaning that the second decoding operation performed based on the decoding mode (s) has a high probability of failing to correct all the errors in the first data. Therefore, when the decoding parameter is not less than the threshold value TH(s), directly skipping the decoding mode (s) with lower decoding ability and using the decoding mode (k) with higher decoding ability to decode the data also facilitates improving the decoding efficiency of the first data.

In an exemplary embodiment, after the second decoding operation is performed on the first data based on the decoding mode (k), if the second decoding operation fails (i.e., the second decoding operation performed based on the decoding mode (k) cannot correct all the errors in the first data), the memory management circuit 51 may instruct the decoding circuit to perform the second decoding operation again based on the decoding mode (k+1) until the decoding mode is exhausted. In addition, if the second decoding operation performed on the first data based on decoding mode (k) is successful (i.e., the second decoding operation performed based on the decoding mode (k) may correct all the errors in the first data), the memory management circuit 51 may output the successfully decoded data.

In an exemplary embodiment, after the second decoding operation is performed on the first data based on the first decoding mode, the memory management circuit 51 may adjust the first threshold value corresponding to the first decoding mode according to the execution result of the second decoding operation. For example, it is assumed that the first decoding mode is the decoding mode (k). After the second decoding operation is performed on the first data based on the decoding mode (k), in response to the execution result of the second decoding operation being a failure, the memory management circuit 51 may reduce the threshold value (k) corresponding to the decoding mode (k), for example, by reducing the threshold value (k) from the first value to the second value. On the other hand, in response to the execution result of the second decoding operation being a success, the memory management circuit 51 may increase the threshold value (k), for example, by increasing the threshold value (k) from the first value to the third value.

In an exemplary embodiment, after the second decoding operation is performed on the first data based on the first decoding mode, the memory management circuit 51 may update the decoding success rate corresponding to the first decoding mode according to the execution result of the second decoding operation. Then, the memory management circuit 51 may adjust the first threshold value corresponding to the first decoding mode according to the updated decoding success rate. For example, it is assumed that the first decoding mode is the decoding mode (k). The memory management circuit 51 may determine whether the decoding success rate of the decoding mode (k) is lower than the lower limit of the success rate or higher than the upper limit of the success rate. In response to the decoding success rate of the decoding mode (k) being lower than the lower limit of the success rate, the memory management circuit 51 may decrease the threshold value (k), for example, by reducing the threshold value (k) from the first value to the second value. Alternatively, in response to the decoding success rate of the decoding mode (k) being higher than the upper limit of the success rate, the memory management circuit 51 may increase the threshold value (k), for example, by increasing the threshold value (k) from the first value to the third value. In an exemplary embodiment, by dynamically adjusting the threshold value corresponding to at least one decoding mode, the threshold value corresponding to each decoding mode may be more in line with the current device status.

Figure 13:
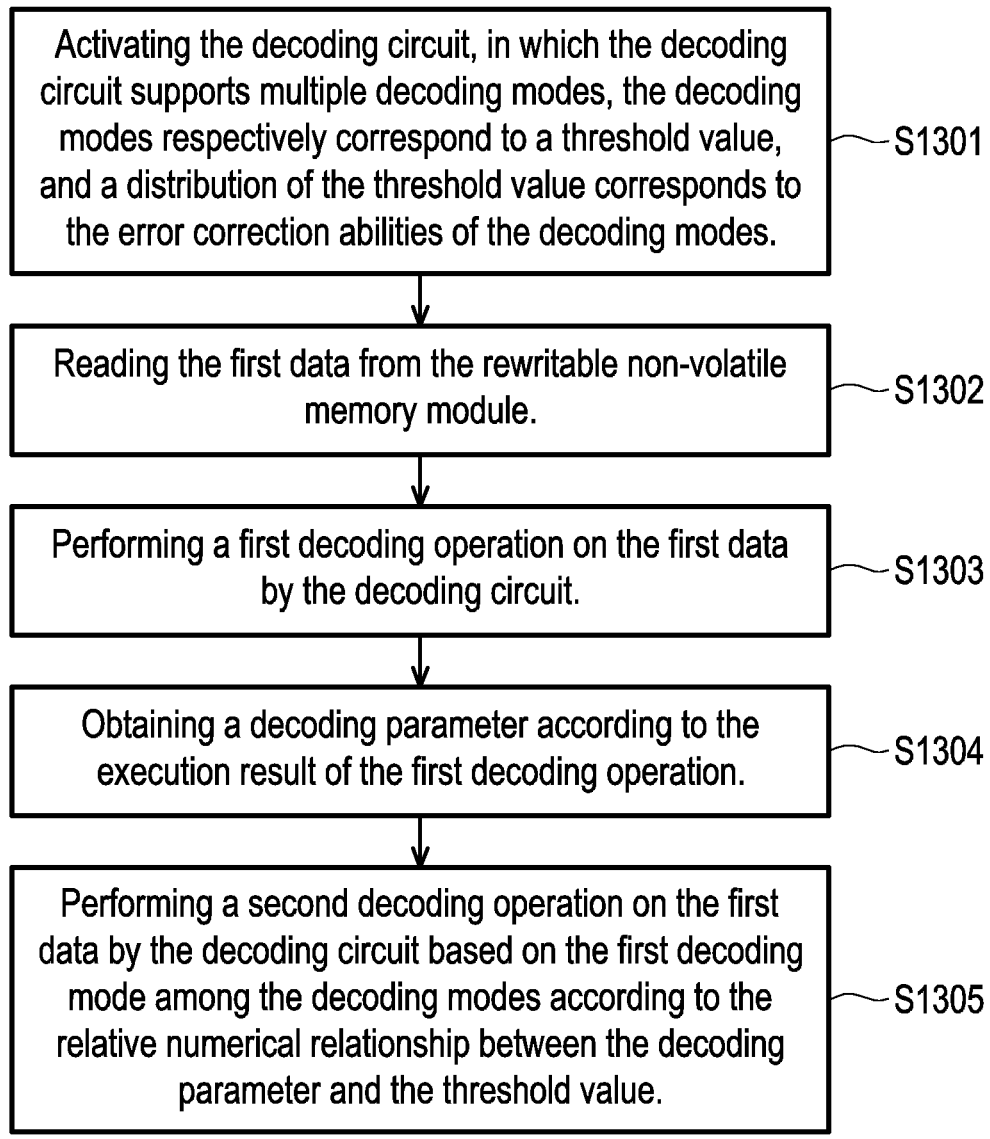
FIG. 13 is a flowchart of a decoding method according to an exemplary embodiment of the disclosure.

FIG. 13 is a flowchart of a decoding method according to an exemplary embodiment of the disclosure.

Referring to FIG. 13, in step S1301, the decoding circuit is activated, in which the decoding circuit supports multiple decoding modes, the decoding modes respectively correspond to a threshold value, and a distribution of the threshold value corresponds to the error correction abilities of the decoding modes. In step S1302, the first data is read from the rewritable non-volatile memory module. In step S1303, a first decoding operation is performed on the first data by the decoding circuit. In step S1304, a decoding parameter is obtained according to the execution result of the first decoding operation. In step S1305, according to the relative numerical relationship between the decoding parameter and the threshold value, a second decoding operation is performed on the first data by the decoding circuit based on the first decoding mode among the decoding modes.

Figure 14:
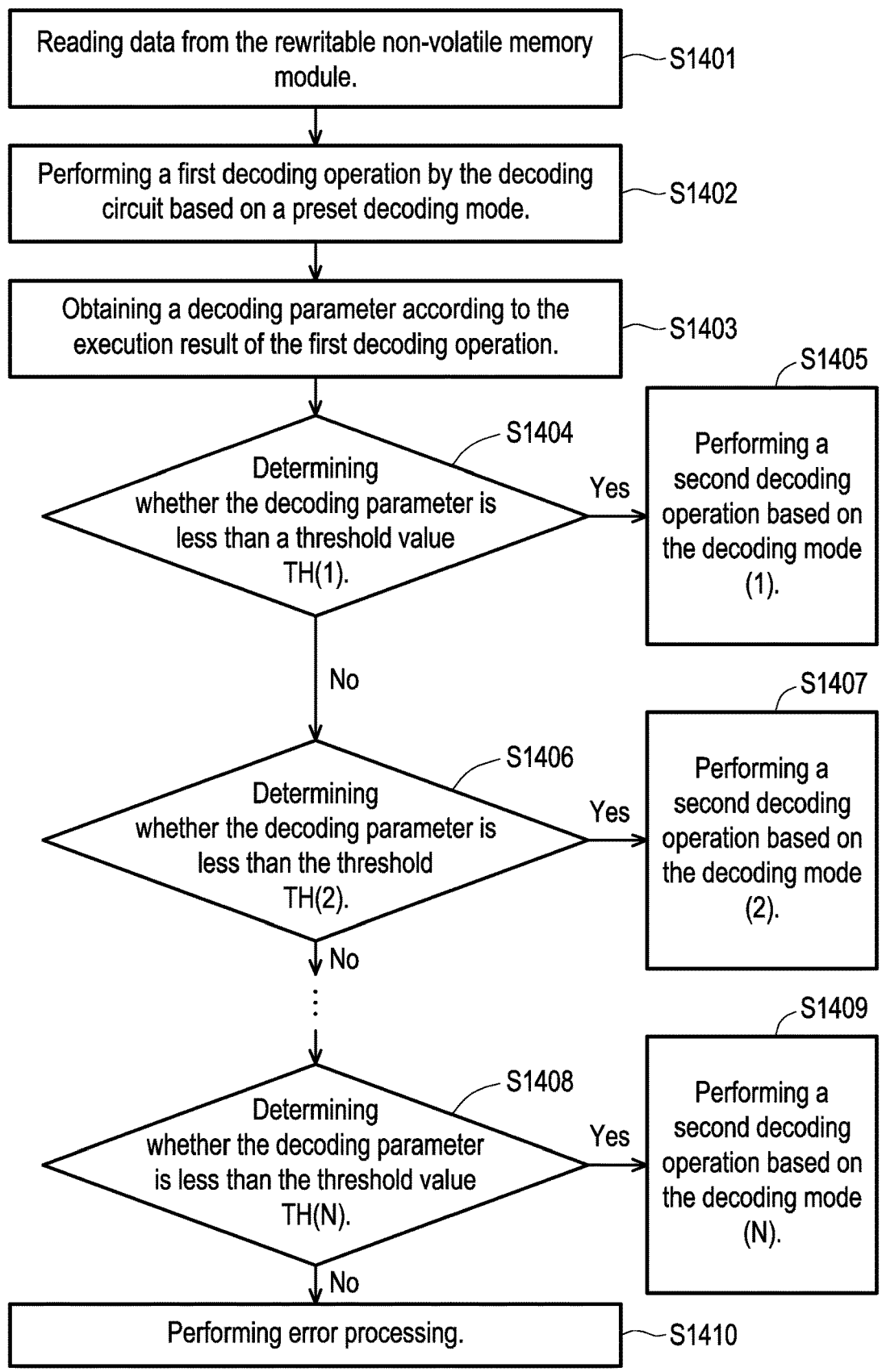
FIG. 14 is a flowchart of a decoding method according to an exemplary embodiment of the disclosure.

FIG. 14 is a flowchart of a decoding method according to an exemplary embodiment of the disclosure.

Referring to FIG. 14, in step S1401, data (i.e., the first data) is read from the rewritable non-volatile memory module. In step S1402, a first decoding operation is performed on the data by the decoding circuit based on a preset decoding mode. In step S1403, a decoding parameter is obtained according to the execution result of the first decoding operation. In step S1404, it is determined whether the decoding parameter is less than a threshold value TH(1). If the decoding parameter is less than the threshold value TH(1), in step S1405, the decoding circuit performs a second decoding operation on the data based on the decoding mode (1). If the decoding parameter is not less than the threshold TH(1), in step S1406, it is determined whether the decoding parameter is less than the threshold TH(2). If the decoding parameter is less than the threshold value TH(2), in step S1407, the decoding circuit performs a second decoding operation on the data based on the decoding mode (2). By analogy, in step S1408, it is determined whether the decoding parameter is less than the threshold value TH(N). If the decoding parameter is less than the threshold value TH(N), in step S1409, the decoding circuit performs a second decoding operation on the data based on the decoding mode (N). In addition, if the decoding parameter is not less than the threshold value TH(N), in step S1410, error processing is performed. For example, another decoding mode is activated to decode data or send an error message to the host system, which is not limited in the disclosure.

However, each step in FIG. 13 and FIG. 14 has been described in detail as the above, and are not repeated herein. It should be noted that each step in FIG. 13 and FIG. 14 may be implemented as multiple program codes or circuits, which is not limited by the disclosure. In addition, the methods of FIG. 13 and FIG. 14 may be used in conjunction with the above exemplary embodiments, or may also be used alone, which is not limited by the disclosure.

To sum up, the exemplary embodiments of the disclosure proposes that the decoding mode to be adopted next is dynamically determined from multiple decoding modes according to the relative numerical relationship between the decoding parameter and at least one threshold value, which may effectively improve the decoding efficiency. In addition, the threshold value corresponding to each decoding mode may also be dynamically adjusted according to the decoding success rate of each decoding mode, so that the threshold value corresponding to each decoding mode is more in line with the current device status.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:

1. A decoding method, used in a rewritable non-volatile memory module, the decoding method comprising:
    activating decoding circuit, wherein the decoding circuit supports a plurality of decoding modes, the decoding modes respectively correspond to a threshold value, and a distribution of the threshold value corresponds to error correction abilities of the decoding modes;
    reading first data from the rewritable non-volatile memory module;
    performing a first decoding operation on the first data by the decoding circuit;
    obtaining a decoding parameter according to an execution result of the first decoding operation; and
    performing a second decoding operation on the first data by the decoding circuit based on a first decoding mode among the decoding modes according to a relative numerical relationship between the decoding parameter and the threshold value.

2. The decoding method according to claim 1, wherein the decoding parameter is related to a bit error rate of the first data.

3. The decoding method according to claim 2, wherein obtaining the decoding parameter according to the execution result of the first decoding operation comprises:
    obtaining a syndrome vector according to the execution result of the first decoding operation, wherein the syndrome vector comprises a plurality of syndromes; and
    obtaining the decoding parameter according to a sum of the syndromes.

4. The decoding method according to claim 1, wherein performing the second decoding operation on the first data by the decoding circuit based on the first decoding mode among the decoding modes according to the relative numerical relationship between the decoding parameter and the threshold value comprises:
    comparing the decoding parameter with the threshold value; and
    determining the first decoding mode from the decoding modes according to a comparison result.

5. The decoding method according to claim 1, wherein the first decoding mode corresponds to a first threshold value, and performing the second decoding operation on the first data by the decoding circuit based on the first decoding mode among the decoding modes according to the relative numerical relationship between the decoding parameter and the threshold value comprises:
    performing the second decoding operation on the first data by the decoding circuit based on the decoding mode in response to the decoding parameter being less than the first threshold value.

6. The decoding method according to claim 5, wherein performing the second decoding operation on the first data by the decoding circuit based on the decoding mode comprises:

skipping the second decoding mode by the decoding circuit and performing the second decoding operation on the first data based on the first decoding mode in response to the decoding parameter not being less than a second threshold value corresponding to a second decoding mode in the decoding modes, wherein the second threshold value is less than the first threshold value, and an error correction ability of the second decoding mode is lower than an error correction ability of the first decoding operation.

7. The decoding method according to claim 1, further comprising:

adjusting a first threshold value corresponding to the first decoding mode according to an execution result of the second decoding operation after performing the second decoding operation on the first data based on the first decoding mode.

8. The decoding method according to claim 7, wherein adjusting the first threshold value corresponding to the first decoding mode according to the execution result of the second decoding operation comprises:

updating a decoding success rate corresponding to the first decoding mode according to the execution result of the second decoding operation; and adjusting the first threshold value according to the decoding success rate.

9. A memory storage device, comprising:

a connection interface unit, used for coupling to a host system a rewritable non-volatile memory module, and a memory control circuit unit, coupled to the connection interface unit and the rewritable non-volatile memory module, wherein the memory control circuit unit supports a plurality of decoding modes, the decoding modes respectively correspond to a threshold value, and a distribution of the threshold value corresponds to error correction abilities of the decoding modes, the memory control circuit unit is used for:

sending a read command sequence, which instructs to read first data from the rewritable non-volatile memory module;

performing a first decoding operation on the first data;

obtaining a decoding parameter according to an execution result of the first decoding operation; and performing a second decoding operation on the first data based on a first decoding mode among the decoding modes according to a relative numerical relationship between the decoding parameter and the threshold value.

10. The memory storage device according to claim 9, wherein the decoding parameter is related to a bit error rate of the first data.

11. The memory storage device according to claim 10, wherein the memory control circuit unit obtaining the decoding parameter according to the execution result of the first decoding operation comprises:

obtaining a syndrome vector according to the execution result of the first decoding operation, wherein the syndrome vector comprises a plurality of syndromes; and obtaining the decoding parameter according to a sum of the syndromes.

12. The memory storage device according to claim 9, wherein the memory control circuit unit performing the second decoding operation on the first data based on the first decoding mode among the decoding modes according to the relative numerical relationship between the decoding parameter and the threshold value comprises:

comparing the decoding parameter with the threshold value; and determining the first decoding mode from the decoding modes according to a comparison result.

13. The memory storage device according to claim 9, wherein the first decoding mode corresponds to a first threshold value, and the memory control circuit unit performing the second decoding operation on the first data based on the first decoding mode among the decoding modes according to the relative numerical relationship between the decoding parameter and the threshold value comprises:

performing the second decoding operation on the first data based on the decoding mode in response to the decoding parameter being less than the first threshold value.

14. The memory storage device according to claim 13, wherein the memory control circuit unit performing the second decoding operation on the first data based on the decoding mode comprises:

skipping the second decoding mode and performing the second decoding operation on the first data based on the first decoding mode in response to the decoding parameter not being less than a second threshold value corresponding to a second decoding mode in the decoding modes, wherein the second threshold value is less than the first threshold value, and an error correction ability of the second decoding mode is lower than an error correction ability of the first decoding operation.

15. The memory storage device according to claim 9, wherein the memory control circuit unit is further used for:

adjusting a first threshold value corresponding to the first decoding mode according to an execution result of the second decoding operation after performing the second decoding operation on the first data based on the first decoding mode.

16. The memory storage device according to claim 15, wherein the memory control circuit unit adjusting the first threshold value corresponding to the first decoding mode according to the execution result of the second decoding operation comprises:

updating a decoding success rate corresponding to the first decoding mode according to the execution result of the second decoding operation; and adjusting the first threshold value according to the decoding success rate.

17. A memory control circuit unit, used for controlling a rewritable non-volatile memory module, the memory control circuit unit comprising:

a host interface, used for coupling to the host system;

a memory interface, used for coupling to the rewritable non-volatile memory module a decoding circuit; and a memory management circuit, coupled to the host interface, the memory interface, and the decoding circuit, wherein the decoding circuit supports a plurality of decoding modes, the decoding modes respectively correspond to a threshold value, and a distribution of the threshold value corresponds to error correction abilities of the decoding modes, the memory management circuit unit is used for:

sending a read command sequence, which instructs to read first data from the rewritable non-volatile memory module;

performing a first decoding operation on the first data by the decoding circuit;

obtaining a decoding parameter according to an execution result of the first decoding operation; and instructing the decoding circuit to perform a second decoding operation on the first data based on a first decoding mode among the decoding modes according to a relative numerical relationship between the decoding parameter and the threshold value.

18. The memory control circuit unit according to claim 17, wherein the decoding parameter is related to a bit error rate of the first data.

19. The memory control circuit unit according to claim 18, wherein the memory management circuit obtaining the decoding parameter according to the execution result of the first decoding operation comprises:

obtaining a syndrome vector according to the execution result of the first decoding operation, wherein the syndrome vector comprises a plurality of syndromes; and obtaining the decoding parameter according to a sum of the syndromes.

20. The memory control circuit unit according to claim 17, wherein the memory management circuit instructing the decoding circuit to perform the second decoding operation on the first data based on the first decoding mode among the decoding modes according to the relative numerical relationship between the decoding parameter and the threshold value comprises:

comparing the decoding parameter with the threshold value; and determining the first decoding mode from the decoding modes according to a comparison result.

21. The memory control circuit unit according to claim 17, wherein the first decoding mode corresponds to a first threshold value, and the memory management circuit instructing the decoding circuit to perform the second decoding operation on the first data based on the first decoding mode among the decoding modes according to the relative numerical relationship between the decoding parameter and the threshold value comprises:

instructing the decoding circuit to perform the second decoding operation on the first data based on the decoding mode in response to the decoding parameter being less than the first threshold value.

22. The memory control circuit unit according to claim 21, wherein the memory management circuit instructing the decoding circuit to perform the second decoding operation on the first data based on the decoding mode comprises:

skipping the second decoding mode and instructing the decoding circuit to perform the second decoding operation on the first data based on the first decoding mode in response to the decoding parameter not being less than a second threshold value corresponding to a second decoding mode in the decoding modes, wherein the second threshold value is less than the first threshold value, and an error correction ability of the second decoding mode is lower than an error correction ability of the first decoding operation.

23. The memory control circuit unit according to claim 17, wherein the memory management circuit is further used for:

adjusting a first threshold value corresponding to the first decoding mode according to an execution result of the second decoding operation after the decoding circuit performs the second decoding operation on the first data based on the first decoding mode.

24. The memory control circuit unit according to claim 23, wherein the memory management circuit adjusting the first threshold value corresponding to the first decoding mode according to the execution result of the second decoding operation comprises:

updating a decoding success rate corresponding to the first decoding mode according to the execution result of the second decoding operation; and adjusting the first threshold value according to the decoding success rate.

* * * * *